(12) United States Patent
Pan

(10) Patent No.: US 6,351,002 B1
(45) Date of Patent: Feb. 26, 2002

(54) PHOTODIODE

(75) Inventor: Jui-Hsiang Pan, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/611,594

(22) Filed: Jul. 7, 2000

(30) Foreign Application Priority Data

Jul. 3, 2000 (TW) .......................................... 89113125

(51) Int. Cl.$^7$ ............................................ H01L 27/148
(52) U.S. Cl. ........................ 257/233; 257/291; 438/57
(58) Field of Search .............................. 257/292, 233, 257/291, 225, 53, 432, 435, 446; 438/59, 433, 57

(56) References Cited

U.S. PATENT DOCUMENTS

| | | | | |
|---|---|---|---|---|
| 6,023,081 A | * | 2/2000 | Drowley et al. | 257/292 |
| 6,040,593 A | * | 3/2000 | Park | 257/292 |
| 6,118,142 A | * | 9/2000 | Chen et al. | 257/232 |
| 6,150,189 A | * | 11/2000 | Pan | 438/59 |
| 6,177,333 B1 | * | 1/2001 | Rhodes | 438/433 |
| 6,184,055 B1 | * | 2/2001 | Yang et al. | 438/57 |
| 6,207,984 B1 | * | 3/2001 | Chang | 257/291 |
| 6,232,626 B1 | * | 5/2001 | Rhodes | 257/292 |

* cited by examiner

*Primary Examiner*—David Nelms
*Assistant Examiner*—Bau T Le
(74) *Attorney, Agent, or Firm*—Thomas, Kayden, Horstemeyer & Risley

(57) ABSTRACT

A photodiode. A second conductive type heavily doped region is located in a first conductive type doped substrate, and a dopant concentration of the second conductive type heavily doped region is larger than that of the first conductive type doped substrate. A dummy isolation is at a periphery of the second conductive type heavily doped region. A first conductive type heavily doped region is located at a periphery of the dummy isolation layer in the first conductive type doped substrate. A dopant concentration of the first conductive type heavily doped region is larger than that of the first conductive type substrate. An isolation layer is located at a periphery of the first conductive type doped region with a width much larger than that of the dummy isolation layer.

26 Claims, 2 Drawing Sheets

PHOTODIODE

CROSS-REFERENCE TO RELATED APPLICATION

This application claims the priority benefit of Taiwan application serial no. 89113125, filed Jul. 3, 2000.

BACKGROUND OF THIS INVENTION

1. Field of the Invention

This invention relates to a photosensitive device, and more particularly, to a photodiode and a photodiode complementary metal-oxide semiconductor (CMOS) image sensor.

2. Description of Related Prior Art

Photodiode image sensor is a widely applied image-sensing device. A typical photodiode image sensor comprises at least a reset transistor and a photodiode. Taking a photodiode with an N-type heavily doped region in a P-type substrate as an example, a voltage is applied to a gate of the reset transistor while operating the photodiode sensor. The reset transistor is thus switched on to charge a junction capacitor of this $n^+/p$ photodiode. A large depletion region is induced with a reverse bias. When a specific potential is reached, the reset transistor is switched off. Once a light is impinged on the photosensitive region of the $n^+/p$ photodiode, the generated electrons and holes are separated by the electric field of the depletion region. As a consequence, the electrons flow towards the n-type region to reduce the potential thereof, while the holes flow to the p-type substrate.

For measuring opto-electronic signals, when the electrons in the N-type doped region is transferred to a bus line driven by another transistor, the generated charges caused by the impingement of light are directly transferred to the bus line for reading operation without being processed by any amplifier. This kind of photosensor is the so-called "passive pixel photodiode". In contrast, if the N-type doped region is coupled to a source follower constructed by several transfer transistors, the magnitude of impinging light can be derived according to the voltage drop caused by electron transfer to the gate of the transistor. Since the current provided by the source follower is larger, the voltage at the bus line is more stable with a smaller noise. This kind of photosensor is called the "active pixel photodiode".

In recent years, many low cost photodiode CMOS image sensor applications have the active photodiode CMOS image sensor replaced the charge coupled device (CCD). This is because the active photodiode CMOS sensor provides characteristics such as high quantum efficiency, low read noise, high dynamic range and random access. In addition, it is highly compatible with CMOS device fabrication process. Therefore, other control circuits, analog-to-digital circuits (A/D converter), and digital signal processing circuits can be integrated into a single chip to achieve the so-called "system on a chip" (SOC).

In a common photodiode CMOS image sensor as shown in FIG. 1, photodiodes 104 are arranged as a photodiode array 102. Each photodiode comprises a P-type substrate 100, an N-type heavily doped region 130, an N-type lightly doped region 140, a field oxide (FOX) layer 110 and a P-type channel stop region, that is, a p⁻field channel stop 120. The N-type heavily doped region 130 is located in the P-type substrate 100 to reduce the sheet resistance ($R_s$) of the photodiode 104, so as to improve the resistance-capacitance (RC) delay. The field oxide layer 110 is located at a peripheral of the N-type heavily doped region 130 for isolation of photodiodes 104. The field oxide layer 110 is formed by local oxidation (LOCOS). The N-type lightly doped region 140 is located under the N-type heavily doped region 130, so to (reduce) current leakage between the edge of the field oxide layer 110 and neighboring contact windows. The p⁻field channel stop 120 is located under the field oxide layer 110. Moreover, P-type heavily doped regions 150 for grounding purpose are located at two ends of the photodiode array 102.

The conventional photodiode array has some drawbacks. Firstly, a bird's beak is formed at the edge of the oxide layer 110 after performing LOCOS. High stress from this bird's beak causes bird's beak dislocation at neighboring P substrate. An ion implantation step for forming the p⁻field channel stop 120 further exaggerates the degree of dislocation. As a result, current leakage phenomena happen readily at the edge of the oxide layer 110. Secondly, since the P-type heavily doped regions 150 for grounding purpose are located at the two ends of the photodiode array 102, this causes electric field distributing non-uniformly in the photodiode array 102. The non-uniform electric field then causes pike field induced leakage path in the photodiode array 102. These drawbacks increase noise during photosensing measurement and reduce stability of photodiode CMOS image sensor, thus are disadvantageous to mass production.

SUMMARY OF THIS INVENTION

This invention provides a photodiode comprising a first conductive type doped substrate, a second conductive type heavily doped region, a dummy isolation layer, a first conductive type heavily doped region and an isolation layer. The second conductive type heavily doped region is located in the first conductive doped substrate of which the doping concentration is lower than that of the second conductive type heavily doped region. The dummy isolation layer is formed at the peripheral of the second conductive type heavily doped region. The first conductive type heavily doped region is located at the peripheral of the dummy isolation layer in the first conductive doped substrate. Dopant concentration in the first conductive type heavily doped region is higher than that of the first conductive type doped substrate. The isolation layer is located at the peripheral of the first conductive heavily doped region of which the width is significantly larger than that of the dummy isolation layer.

The foregoing isolation layer, for example, is an oxide layer formed by, as an example, LOCOS. The dummy isolation layer, for example, is also an oxide layer formed by, as an example, LOCOS.

The invention also provides a photodiode array which is formed by several photodiodes. The photodiodes are separated from each other by the isolation layers and are grounded individually at first conductive type heavily doped regions.

Furthermore, this invention provides a photodiode CMOS image sensor which is suitable for use on a doped substrate. The photodiode CMOS image sensor comprises at least a CMOS device and a photodiode provided. The CMOS device is formed on a doped substrate as a reset transistor. This reset transistor also comprises a gate oxide layer and a second conductive type source region connected to the second conductive type heavily doped region of the photodiode.

As described above, in the photodiode provided by this invention, the dummy isolation layer is used to separate the second conductive type heavily doped region and the isolation layer. If LOCOS is performed on the isolation layer to form an oxide layer, and bird's beak dislocation phenomenon appears at a peripheral of the oxide layer. The photodiodes still would not leak current because of the dummy isolation layer. Moreover, since the width of the dummy isolation layer is far less than that of the isolation layer. If LOCOS is performed on the dummy isolation layer to form an oxide layer, the bird's beak is too small to cause significant dislocation (current leakage) phenomenon. Concerning the photodiode array formed by the photodiodes, the first conductive type heavily doped region of each of the photodiodes can be connected to ground individually. This is unlike the conventional photodiode array that has ground connections at the two ends of a doped region only, electric field thus can be distributed more uniformly and pike field induced leakage path can be eliminated. As a result, the photodiode CMOS image sensor provided by this invention has lower read noise and higher quality reliability which are advantageous to mass production.

The photodiode, provided by this invention, further comprises a second conductive type lightly doped region located under the second conductive type heavily doped region. This is to further reduce current leakage phenomenon at the peripheral of the isolation layer. In addition, the photodiode provided by this invention may also comprise a first conductive type channel stop layer located under the isolation layer in the first conductive type doped substrate. This is to further reduce current leakage phenomenon at the peripheral of the isolation layer.

Both the foregoing general description and the following detailed description are exemplary and explanatory only and are not restrictive of the invention, as claimed.

BRIEF DESCRIPTION OF DRAWINGS

The invention can be more fully understood by reading the following detailed description of the preferred embodiment, with reference made to the accompanying drawings.

PREFERRED EMBODIMENT

An n$^+$/p photodiode of a P-type substrate with an N-type doped region is used in this embodiment, but is not restrictive of the invention.

Figure 1:
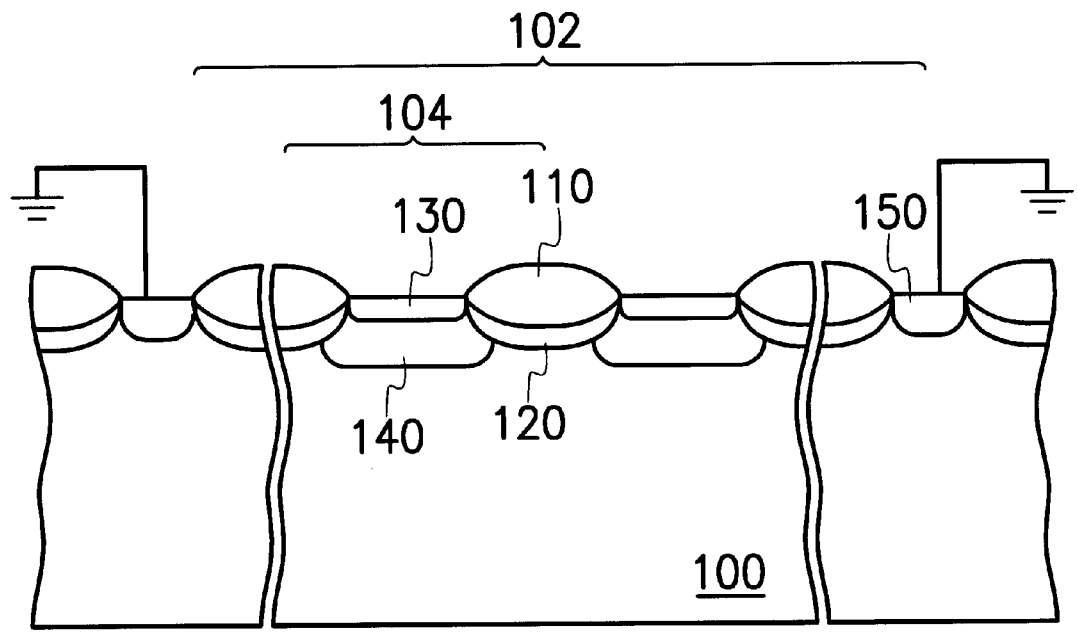
FIG. 1 is a cross sectional view showing a photodiode array formed by conventional photodiodes.
Figure 2:
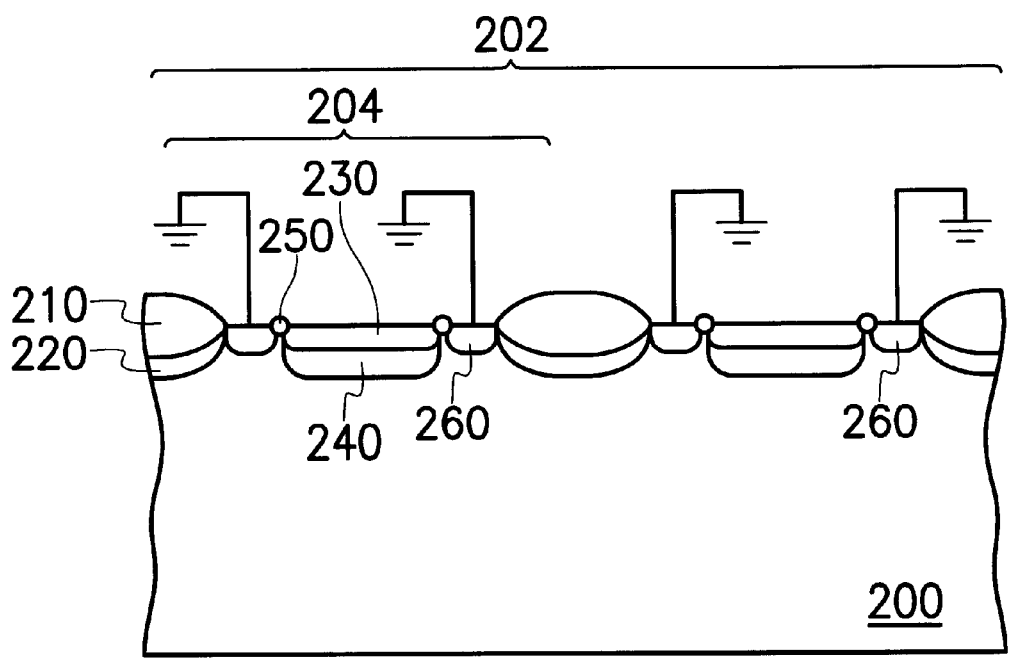
FIG. 2 is a cross sectional view showing an embodiment for a photodiode array formed by photodiodes according to this invention.

In FIG. 2, a cross sectional view of a photodiode array and a photodiode is shown. The photodiode array could be applied in a photodiode CMOS image sensor. As FIG. 2 illustrates, the photodiode array 202 is formed by several photodiodes 204. Each photodiode 204 comprises a P-type substrate 200, an N-type heavily doped region 230, an N-type lightly doped region 240, a dummy isolation layer 250, a P-type heavily doped region 260, an oxide layer 210 and a channel stop layer 220.

The N-type heavily doped region 230 is located in the P-type substrate 200 of which the doping concentration is lower than that of the N-type heavily doped region 230. The N-type lightly doped region 240 is located under the N-type heavily doped region 230, so that leakage current phenomenon at the peripheral of the oxide layer 210 can be further reduced. The dummy isolation 250 is located at a peripheral of the N-type heavily doped region 230. This dummy layer 250, for example, is an oxide layer formed by, as an example, local oxidation. The P-type heavily doped region 260 is located at a peripheral of the dummy isolation layer 250 in the P-type substrate 200. Doping concentration of this P-type heavily doped region 260 is higher than that of the P-type substrate 200.

Moreover, the oxide layer 210 is located at a peripheral of the P-type heavily doped region 260, so that the oxide layer 210 is used for isolation of each of the photodiodes 204 in the photodiode array 202. This oxide layer 210 is formed by, as an example, local oxidation. The P-type channel stop layer 220 is located under the oxide layer 210 in the P-type substrate 200, so that the P-type channel stop layer 220 could further reduce current leakage phenomenon at boundary of the oxide layer 210.

Figure 3:
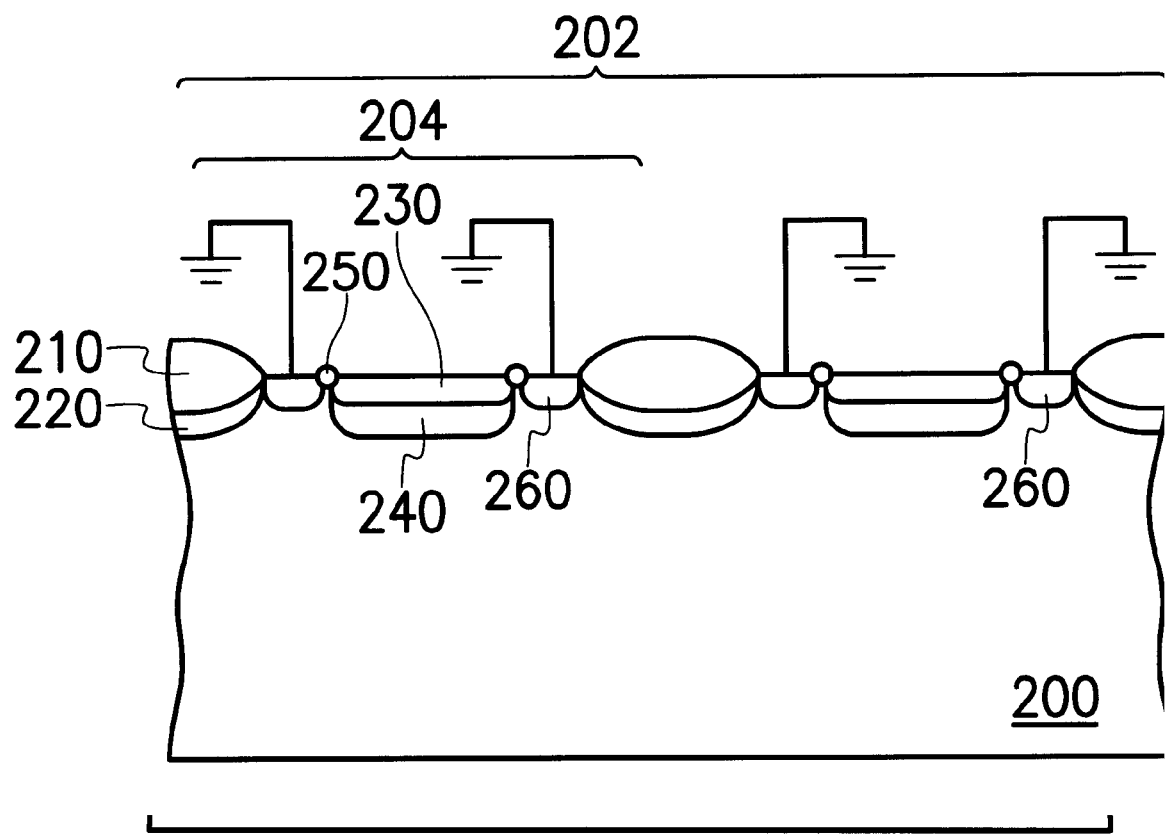
FIG. 3 is a cross sectional view showing an embodiment for a photodiode CMOS image sensor according to this invention.

In FIG. 3, a cross sectional view of a photodiode CMOS image sensor 268 is shown. Only one photodiode 204 is shown, and this photodiode 204 belongs to a photodiode array that is perpendicular to the paper. As FIG. 3 illustrates, the photodiode CMOS image sensor comprises a metal oxide semiconductor device 266 and the photodiode 204 provided by this invention. The metal oxide semiconductor device 266, for example, acts as a reset transistor and is located on the P-type substrate 200. This metal oxide semiconductor device 266 comprises a gate oxide layer 270, a gate 272 on the gate oxide layer 270, spacers 274 at the side walls of the gate 272, an N-type source region 276 and an N-type drain region 278 in the P-type substrate 200 at both sides of the gate 272. The N-type heavily doped region 230 and the lightly doped region 240 of the photodiode 204 are connected with the N-type source region 276. The connection enables the metal semiconductor device acting as a reset transistor to charge the junction capacitor of the n$^+$/p photodiode.

In the photodiode 204 provided by this embodiment of the invention, the N-type heavily doped region 230 (the N-type lightly region 240) and the oxide layer 210 are separated by the dummy isolation layer 250. Thus, bird's beak dislocation at the peripheral of the metal oxide 210 does not cause the photodiodes 204 in the photodiode array 202 to leak current. Moreover, since the width of the dummy isolation layer 250 is far less than that of the oxide layer 210, even if local oxidation is performed on the dummy layer to form an oxide layer, bird's beak is too small to cause significant dislocation (current leakage) phenomenon.

Furthermore, concerning the photodiode array 202, each of the P-type heavily doped regions 260 of the photodiodes 204 can be grounded individually. This is unlike the conventional photodiode array that has ground connections at its two ends only. The electric field can thus be distributed more uniformly, and pike field induced leakage path can be eliminated. As a result, the photodiode CMOS image sensor provided by this invention has lower read noise and higher quality reliability which are advantageous to mass production.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A photodiode, comprising:

a first conductive type doped substrate;

a second conductive type heavily doped region in the first conductive type doped substrate;

a dummy isolation layer at a peripheral of the second conductive type heavily doped region;

a first conductive type heavily doped region in the first conductive type doped substrate at a peripheral of the dummy isolation layer; and an isolation layer at a peripheral of the first conductive type heavily doped region; wherein:

a dopant concentration of the second conductive type heavily doped region is higher than that of the first conductive type doped substrate;

a dopant concentration of the first conductive type heavily doped region is higher than that of the first conductive type doped substrate; and a width of the isolation layer is significantly larger than that of the dummy isolation layer.

2. The photodiode according to claim 1, wherein the isolation layer comprises an oxide layer formed by local oxidation.

3. The photodiode according to claim 1, wherein the dummy isolation layer comprises an oxide layer formed by local oxidation.

4. The photodiode according to claim 1, wherein the dummy isolation layer is used to separate the second conductive type heavily doped region and the isolation layer.

5. The photodiode according to claim 1, wherein the width of the dummy isolation layer is sufficiently small enough such that a bird's beak formed therein is too small to cause a significant current leakage.

6. The photodiode according to claim 1, wherein the photodiode further comprises a second conductive type lightly doped region located under the second conductive type heavily doped region.

7. The photodiode according to claim 1, wherein the photodiode further comprises a first conductive type channel stop layer located under the isolation layer in the first conductive type doped substrate.

8. The photodiode according to claim 1, wherein the first conductive comprises a P-type and the second conductive type comprises an N-type.

9. The photodiode according to claim 1, wherein the first conductive type and the second conductive type comprise an N-type and a P-type, respectively.

10. A photodiode array formed by a plurality of photodiode which are individually grounded, each of the photodiode comprising:

a first conductive type doped substrate;

a second conductive type heavily doped region in the first conductive type doped substrate;

a dummy isolation layer at a peripheral of the second conductive type heavily doped region;

a first conductive type heavily doped region at a peripheral of the dummy isolation layer in the first conductive type doped substrate; and an isolation layer at a peripheral of the first conductive type heavily doped region; wherein a dopant concentration of the second conductive type heavily doped region is higher than that of the first conductive type doped substrate;

a dopant concentration of the first conductive type heavily doped region is higher than that of the first conductive type doped substrate;

a width of the isolation layer is significantly larger than that of the dummy isolation layer;

the first conductive type heavily doped region is grounded individually; and each of the photodiode is separated from the others in the photodiode array by the isolation layer.

11. The photodiode array according to claim 10, wherein the isolation layers comprise an oxide layer formed by local oxidation.

12. The photodiode array according to claim 10, wherein the dummy isolation layers of the photodiodes comprise an oxide layer formed by local oxidation.

13. The photodiode array according to claim 10, further comprises a second conductive type lightly doped region located under each of the second conductive type heavily doped regions.

14. The photodiode array according to claim 10, further comprises a first conductive type channel stop layer located under each of the isolation layers in the first conductive type doped substrate.

15. The photodiode array according to claim 10, wherein the first conductive comprises a P-type and the second conductive type comprises an N-type.

16. The photodiode array according to claim 10, wherein the first conductive comprises an N-type and the second conductive type comprises a P-type.

17. A photodiode complementary metal-oxide semiconductor image sensor, comprising:

a first conductive type doped substrate;

a second conductive type heavily doped region in the first conductive type doped substrate;

a dummy isolation layer at a peripheral of the second conductive type heavily doped region;

a first conductive type heavily doped region in the first conductive type doped substrate at a peripheral of the dummy isolation layer;

an isolation layer at a peripheral of the first conductive type heavily doped region; and a metal oxide semiconductor device on the first conductive type doped substrate, further comprises:

a gate oxide layer and a second conductive type source region connected to the second conductive type heavily doped region;

wherein a dopant concentration of the second conductive type heavily doped region is higher than that of the first conductive type doped substrate;

a dopant concentration of the first conductive type heavily doped region is higher than that of the first conductive doped substrate; and a width of the dummy isolation layer is sufficiently small such that even a bird's beak is formed at an edge thereof, a leakage current occurring around the bird's beak is negligible.

18. The photodiode complementary metal-oxide semiconductor image sensor according to claim 17, wherein the isolation layer comprises an oxide layer formed by local oxidation.

19. The photodiode complementary metal-oxide semiconductor image sensor according to claim 17, wherein the dummy isolation layer comprises an oxide layer formed by local oxidation.

20. The photodiode complementary metal-oxide semiconductor image sensor according to 17, wherein the metal oxide semiconductor further comprises a gate located on the gate oxide layer.

21. The photodiode complementary metal-oxide semiconductor image sensor according to 17, wherein the metal oxide semiconductor further comprises a spacer on each side wall of the gate.

22. The photodiode complementary metal-oxide semiconductor image sensor according to 17, wherein the metal oxide semiconductor further comprises a second conductive type drain region in the first conductive type substrate.

23. The photodiode complementary metal-oxide semiconductor image sensor according to claim 17, further comprises a second conductive type lightly doped region located under the second conductive type heavily doped region.

24. The photodiode complementary metal-oxide semiconductor image sensor according to claim 17, further comprises a first conductive type channel stop layer located under the isolation layer in the first conductive doped substrate.

25. The photodiode complementary metal-oxide semiconductor image sensor according to claim 17, wherein the first conductive comprises a P-type and the second conductive comprises an N-type.

26. The photodiode complementary metal-oxide semiconductor image sensor according to claim 17, wherein the first conductive comprises an N-type and the second conductive comprises a P-type.

* * * * *